United States Patent
Lin et al.

(10) Patent No.: US 10,170,385 B2
(45) Date of Patent: Jan. 1, 2019

(54) SEMICONDUCTOR DEVICE AND METHOD OF FORMING STACKED VIAS WITHIN INTERCONNECT STRUCTURE FOR FO-WLCSP

(71) Applicant: STATS ChipPAC Pte. Ltd., Singapore (SG)

(72) Inventors: Yaojian Lin, Singapore (SG); Rui Huang, Singapore (SG); Kang Chen, Singapore (SG); Yu Gu, Singapore (SG)

(73) Assignee: STATS ChipPAC Pte. Ltd., Singapore (SG)

(*) Notice: Subject to any disclaimer, the term of this patent is extended or adjusted under 35 U.S.C. 154(b) by 0 days.

(21) Appl. No.: 15/169,261

(22) Filed: May 31, 2016

(65) Prior Publication Data
US 2016/0276239 A1   Sep. 22, 2016

Related U.S. Application Data

(62) Division of application No. 13/243,558, filed on Sep. 23, 2011, now Pat. No. 9,385,009.

(51) Int. Cl.
*H01L 23/053* (2006.01)
*H01L 23/31* (2006.01)
(Continued)

(52) U.S. Cl.
CPC ...... *H01L 23/3128* (2013.01); *H01L 21/4853* (2013.01); *H01L 21/561* (2013.01); *H01L 21/568* (2013.01); *H01L 23/293* (2013.01); *H01L 23/49811* (2013.01); *H01L 23/49816* (2013.01); *H01L 23/5226* (2013.01); *H01L 23/5389* (2013.01); *H01L 24/19* (2013.01); *H01L 24/20* (2013.01); *H01L 24/32* (2013.01);
(Continued)

(58) Field of Classification Search
CPC ... H01L 21/561; H01L 21/563; H01L 21/568; H01L 2224/73265; H01L 2924/181
USPC ........ 257/700, 773, 774, 787; 438/107, 108, 438/110–112, 125–127
See application file for complete search history.

(56) References Cited

U.S. PATENT DOCUMENTS 5,793,105 A   8/1998   Pace
6,486,545 B1  11/2002   Glenn et al.
(Continued)

*Primary Examiner* — Matthew E Warren
(74) *Attorney, Agent, or Firm* — Robert D. Atkins; Patent Law Group: Atkins and Associates, P.C.

(57) ABSTRACT

A semiconductor device has a semiconductor die mounted to a carrier. An encapsulant is deposited over the semiconductor die and carrier. The carrier is removed. A first insulating layer is formed over the encapsulant and semiconductor die. First vias are formed through the first insulating layer to expose contact pads of the semiconductor die. A first conductive layer is formed over the first insulating layer and into the first vias to electrically connect to the contact pads of the semiconductor die. A second insulating layer is formed over the first insulating layer and first conductive layer. Second vias are formed through the second insulating layer by laser direct ablation and aligned or offset with the first vias to expose the first conductive layer. A second conductive layer is formed over the second insulating layer and into the second vias. Conductive vias can be formed through the encapsulant.

21 Claims, 14 Drawing Sheets

(51) Int. Cl.
*H01L 21/56* (2006.01)
*H01L 23/00* (2006.01)
*H01L 25/10* (2006.01)
*H01L 23/498* (2006.01)
*H01L 21/48* (2006.01)
*H01L 23/538* (2006.01)
*H01L 23/29* (2006.01)
*H01L 23/522* (2006.01)
*H01L 25/065* (2006.01)
*H01L 25/00* (2006.01)

(52) U.S. Cl.
CPC .............. H01L 24/96 (2013.01); H01L 24/97 (2013.01); H01L 25/0657 (2013.01); H01L 25/105 (2013.01); H01L 25/50 (2013.01); H01L 24/03 (2013.01); H01L 24/05 (2013.01); H01L 24/06 (2013.01); H01L 24/48 (2013.01); H01L 24/73 (2013.01); H01L 24/92 (2013.01); H01L 2224/0345 (2013.01); H01L 2224/03452 (2013.01); H01L 2224/03462 (2013.01); H01L 2224/03464 (2013.01); H01L 2224/0401 (2013.01); H01L 2224/05009 (2013.01); H01L 2224/0557 (2013.01); H01L 2224/0558 (2013.01); H01L 2224/05611 (2013.01); H01L 2224/05624 (2013.01); H01L 2224/05639 (2013.01); H01L 2224/05644 (2013.01); H01L 2224/05647 (2013.01); H01L 2224/05655 (2013.01); H01L 2224/06181 (2013.01); H01L 2224/12105 (2013.01); H01L 2224/2518 (2013.01); H01L 2224/32225 (2013.01); H01L 2224/48091 (2013.01); H01L 2224/48227 (2013.01); H01L 2224/73259 (2013.01); H01L 2224/73265 (2013.01); H01L 2224/92144 (2013.01); H01L 2224/94 (2013.01); H01L 2224/97 (2013.01); H01L 2225/1035 (2013.01); H01L 2225/1058 (2013.01); H01L 2924/00014 (2013.01); H01L 2924/01322 (2013.01); H01L 2924/12041 (2013.01); H01L 2924/12042 (2013.01); H01L 2924/1306 (2013.01); H01L 2924/13091 (2013.01); H01L 2924/15192 (2013.01); H01L 2924/15311 (2013.01); H01L 2924/181 (2013.01); H01L 2924/19041 (2013.01); H01L 2924/19042 (2013.01); H01L 2924/19043 (2013.01); H01L 2924/19105 (2013.01)

(56) References Cited

U.S. PATENT DOCUMENTS

| | | | |
|---|---|---|---|
| 6,680,529 B2 | 1/2004 | Chen et al. | |
| 6,750,397 B2 | 6/2004 | Ou et al. | |
| 7,548,430 B1 | 6/2009 | Huemoeller et al. | |
| 7,633,765 B1 | 12/2009 | Scanlan et al. | |
| 7,767,496 B2 * | 8/2010 | Shim | H01L 21/568 257/E21.503 |
| 7,807,512 B2 | 10/2010 | Lee et al. | |
| 8,004,095 B2 | 8/2011 | Shim et al. | |
| 8,183,696 B2 * | 5/2012 | Meyer | H01L 25/16 257/734 |
| 8,252,629 B2 * | 8/2012 | Yee | H01L 21/568 257/E21.499 |
| 8,617,935 B2 | 12/2013 | Xu et al. | |
| 8,796,561 B1 * | 8/2014 | Scanlan | H05K 1/185 174/260 |
| 2005/0062173 A1 | 3/2005 | Vu et al. | |
| 2006/0073638 A1 | 4/2006 | Hsu | |
| 2009/0008793 A1 | 1/2009 | Pohl et al. | |
| 2009/0236686 A1 | 9/2009 | Shim et al. | |
| 2010/0052135 A1 | 3/2010 | Shim et al. | |
| 2010/0053920 A1 | 3/2010 | Zeng | |
| 2010/0224974 A1 | 9/2010 | Shim et al. | |
| 2011/0278736 A1 | 11/2011 | Lin et al. | |
| 2013/0280826 A1 | 10/2013 | Scanlan et al. | |

* cited by examiner

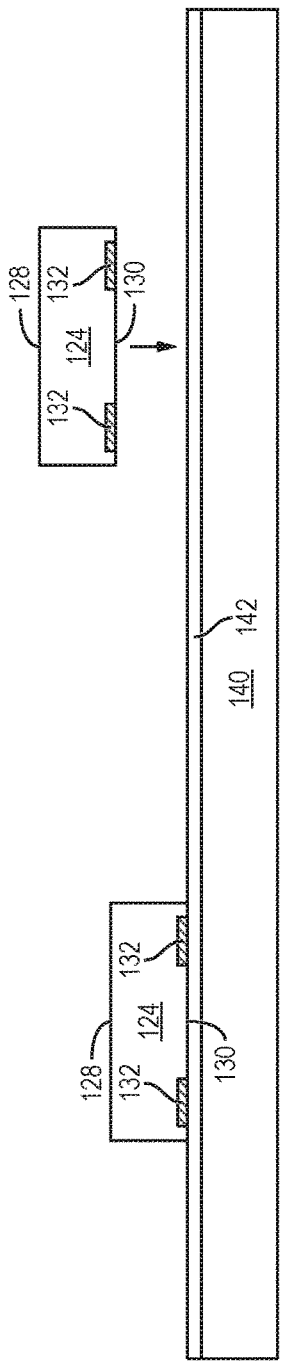
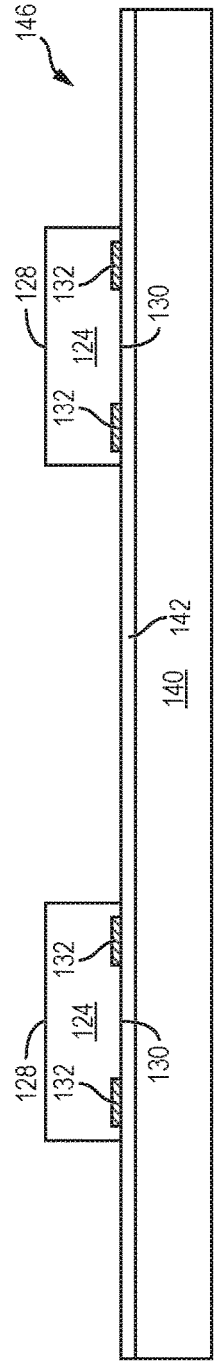
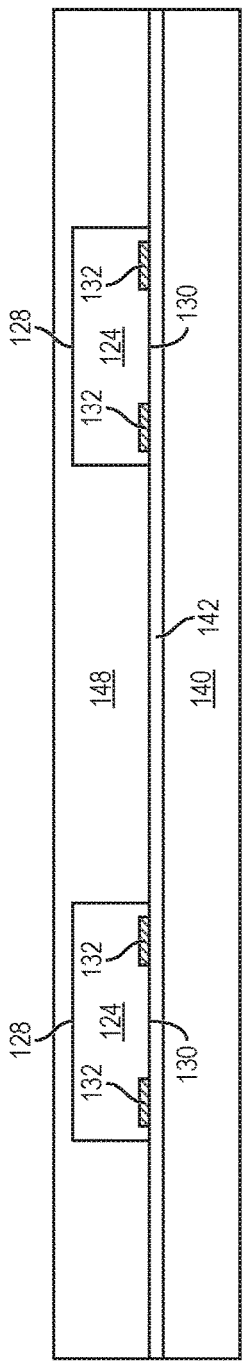

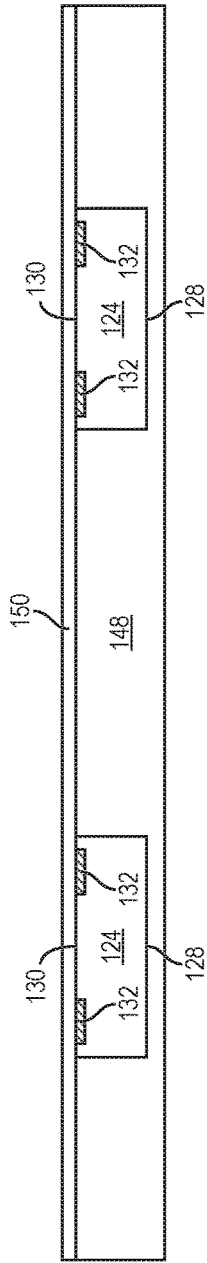
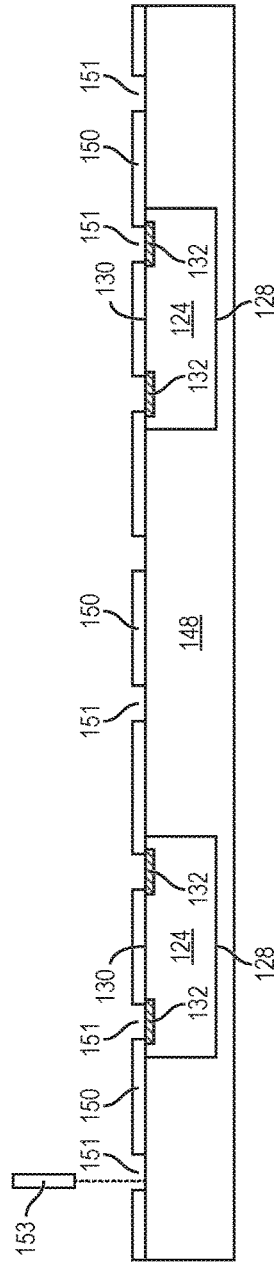
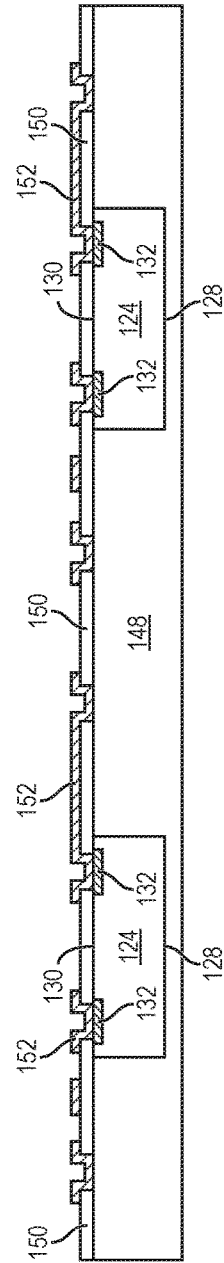

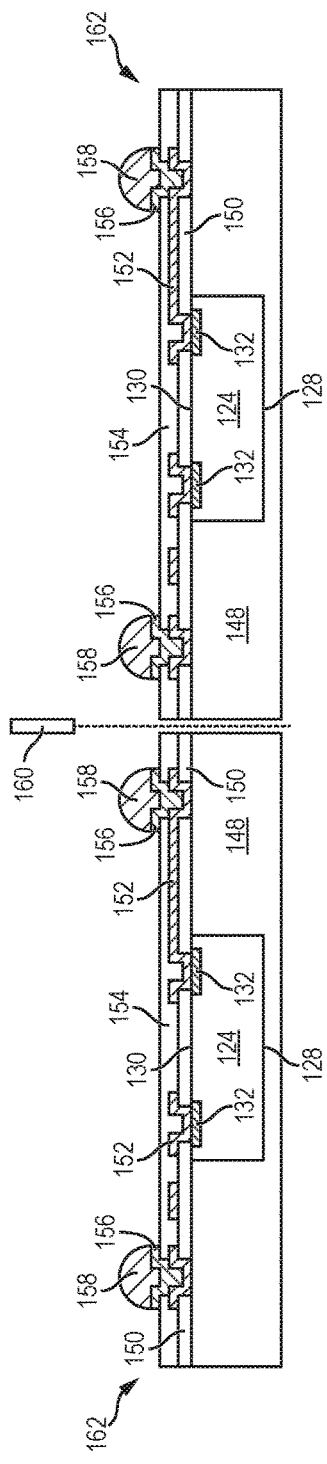
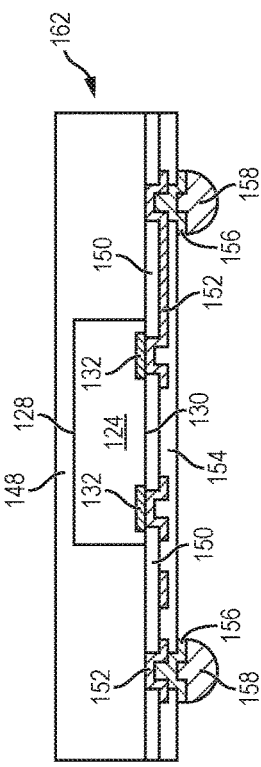
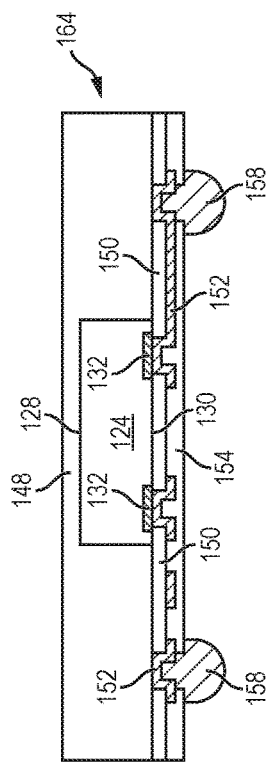
FIG. 4j
FIG. 5
FIG. 6

SEMICONDUCTOR DEVICE AND METHOD OF FORMING STACKED VIAS WITHIN INTERCONNECT STRUCTURE FOR FO-WLCSP

CLAIM TO DOMESTIC PRIORITY

The present application is a division of U.S. patent application Ser. No. 13/243,558, now U.S. Pat. No. 9,385,009, filed Sep. 23, 2011, which application is incorporated herein by reference.

FIELD OF THE INVENTION

The present invention relates in general to semiconductor devices and, more particularly, to a semiconductor device and method of forming stacked vias within an interconnect structure for a Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly, can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

A conventional fan-out wafer level chip scale package (Fo-WLCSP) may contain a semiconductor die with bumps formed over contact pads on an active surface of the die. The semiconductor die is mounted to a substrate and covered with an encapsulant. Alternatively, a bottom-side build-up interconnect structure containing insulating layers and conductive layers is formed over the semiconductor die and encapsulant. Conductive vias or pillars are formed through the encapsulant around the substrate for vertical electrical interconnect. A topside build-up interconnect structure containing insulating layers and conductive layers can be formed over the encapsulant opposite the bottom-side build-up interconnect structure for electrical interconnect. The formation of a topside and bottom-side build-up interconnect structure adds manufacturing cost. In addition, during formation of the topside and bottom-side build-up interconnect structures, a laser is commonly used to remove portion of the insulating layers. The laser is known to penetrate through the underlying conductive layer, which can cause manufacturing defects.

SUMMARY OF THE INVENTION

A need exists for a robust interconnect structure in a Fo-WLCSP with a design margin for laser removal of insulating material. Accordingly, in one embodiment, the present invention is a semiconductor device comprising a semiconductor die and encapsulant deposited over and around the semiconductor die. A first insulating layer is formed over the semiconductor die and encapsulant. A first conductive layer is formed over the first insulating layer and extending through the first insulating layer to the encapsulant. A first conductive via is formed through the encapsulant and extending to the first conductive layer.

In another embodiment, the present invention is a semiconductor device comprising a semiconductor die and encapsulant deposited over the semiconductor die. A first insulating layer is formed over the semiconductor die and encapsulant. A first conductive layer is formed over the first insulating layer and extending through the first insulating layer to the encapsulant. A second insulating layer is formed over the first insulating layer. A second conductive layer is formed over the second insulating layer and a portion of the first conductive layer extending through the first insulating layer to the encapsulant.

In another embodiment, the present invention is a semiconductor device comprising a semiconductor die and encapsulant deposited over the semiconductor die. A first insulating layer is formed over the semiconductor die and encapsulant. A first conductive layer is formed in the first insulating layer. A second insulating layer is formed over the first insulating layer and first conductive layer. A second conductive layer is formed in the second insulating layer and extending a length of the first conductive layer.

In another embodiment, the present invention is a semiconductor device comprising a semiconductor die and encapsulant deposited over the semiconductor die. A first insulating layer is formed over the semiconductor die and encapsulant. A first conductive layer is formed over the first insulating layer and extending through the first insulating layer to the encapsulant.

BRIEF DESCRIPTION OF THE DRAWINGS

FIGS. 4a-4j illustrate a process of forming stacked vias within an interconnect structure for a Fo-WLCSP;

FIG. 5 illustrates the Fo-WLCSP with stacked vias within the interconnect structure;

FIG. 6 illustrates the Fo-WLCSP with stacked vias within the interconnect structure and bumps bonded directly to an RDL;

DETAILED DESCRIPTION OF THE DRAWINGS

Figure 1:
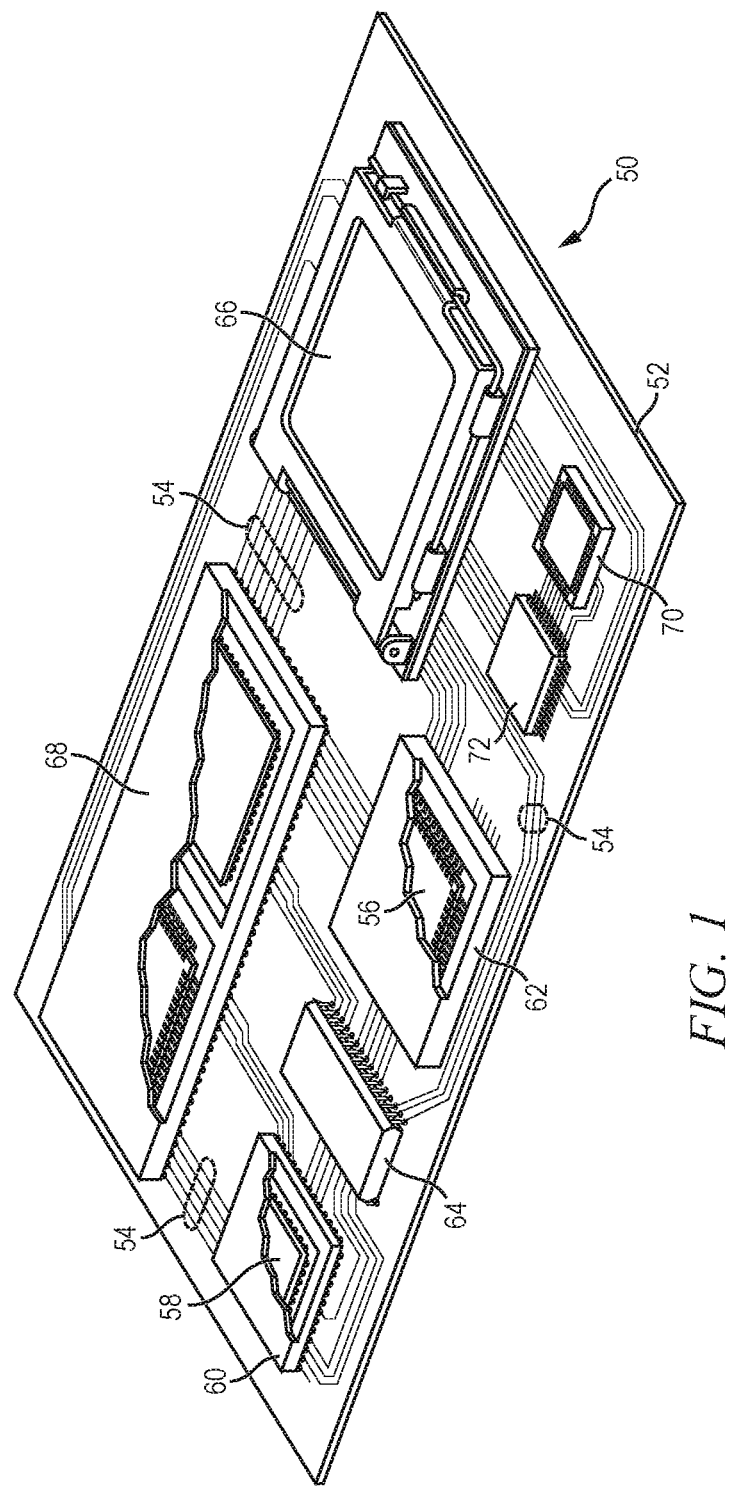
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
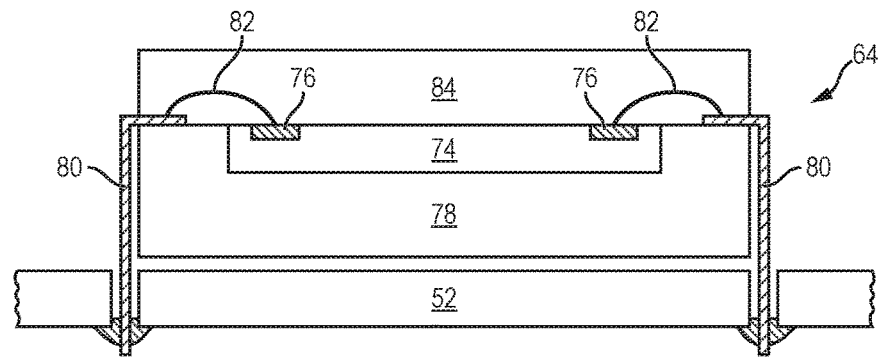
FIGS. 2a-2c illustrate further detail of the representative semiconductor packages mounted to the PCB.
Figure 2B:
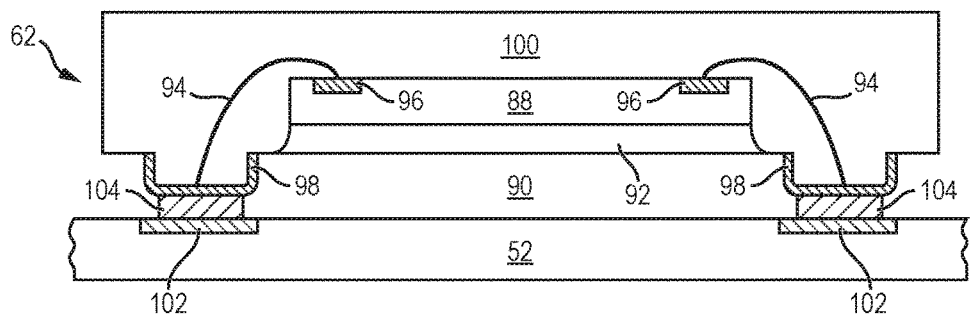
Figure 2C:
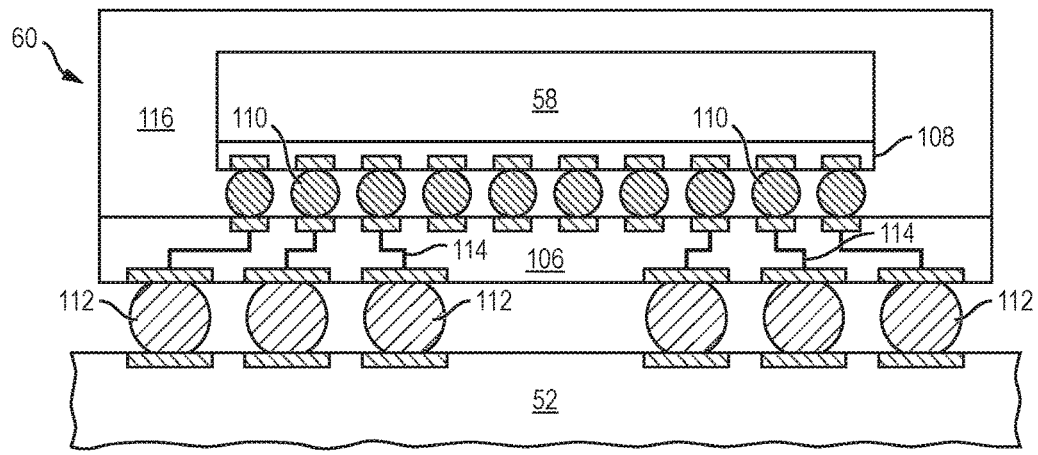

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
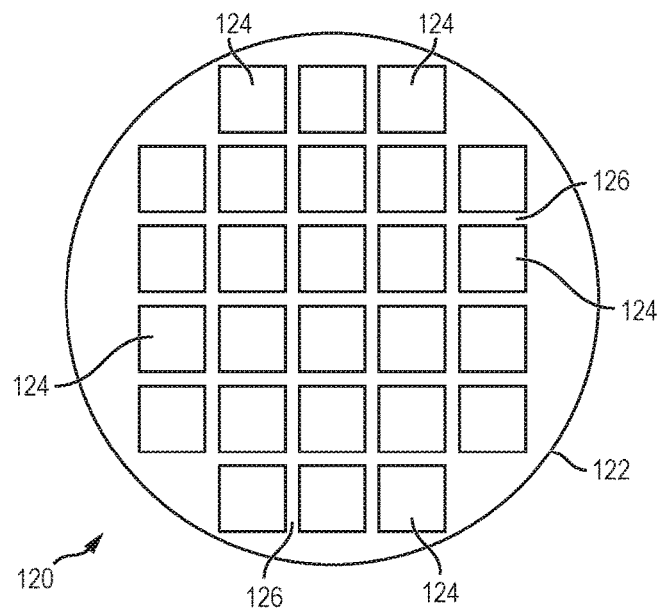
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124.

Figure 3B:
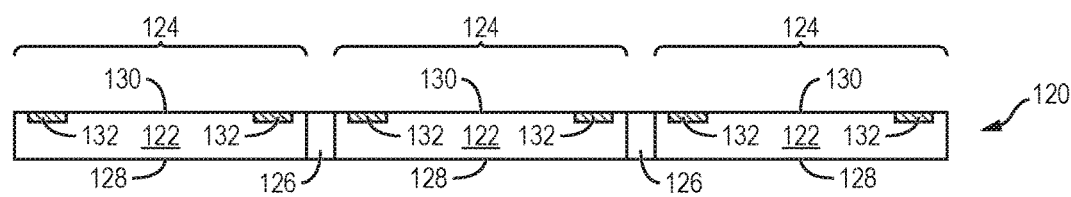

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
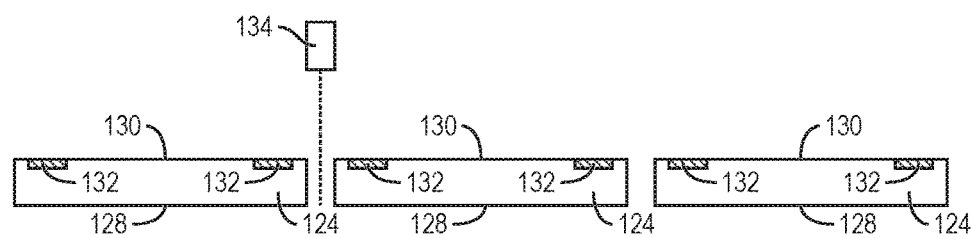

In FIG. 3c, semiconductor wafer 120 is singulated through saw street 126 using a saw blade or laser cutting tool 134 into individual semiconductor die 124.

Figure 4G:
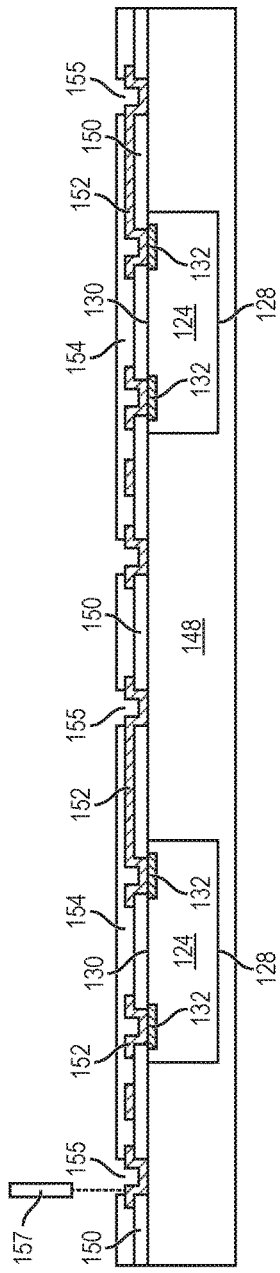

FIGS. 4a-4j illustrate, in relation to FIGS. 1 and 2a-2c, a process of forming stacked vias within an interconnect structure for a Fo-WLCSP. In FIG. 4a, a temporary substrate or carrier 140 contains sacrificial base material such as Cu, silicon, polymer, beryllium oxide, glass, or other suitable low-cost, rigid material for structural support. An interface layer or double-sided tape 142 is formed over carrier 140 as a temporary adhesive bonding film, etch-stop layer, or release layer.

Semiconductor die 124 from FIGS. 3a-3c is mounted to interface layer 142 using a pick and place operation with active surface 130 oriented toward carrier 140. FIG. 4b shows semiconductor die 124 mounted to carrier 140 as a reconstituted wafer 146.

In FIG. 4c, an encapsulant or molding compound 148 is deposited over semiconductor die 124 and carrier 140 using a paste printing, compressive molding, transfer molding, liquid encapsulant molding, vacuum lamination, spin coating, or other suitable applicator. Encapsulant 148 can be polymer composite material, such as epoxy resin with filler, epoxy acrylate with filler, or polymer with proper filler. Encapsulant 148 is non-conductive and environmentally protects the semiconductor device from external elements and contaminants.

In FIG. 4d, carrier 140 and interface layer 142 are removed by chemical etching, mechanical peeling, CMP, mechanical grinding, thermal bake, UV light, laser scanning, or wet stripping to expose active surface 130, conductive layer 132, and encapsulant 148.

An insulating or passivation layer 150 is formed over active surface 130, conductive layer 132, and encapsulant 148 using screen printing, spin coating, spray coating, dispensing, or lamination. The insulating layer 150 contains one or more layers of polyimide, epoxy, acrylic or phenolic polymer with or without filler, or other suitable material having similar insulating and structural properties.

In FIG. 4e, a plurality of vias 151 is formed through insulating layer 150 using laser drilling or wet/dry etching process through a patterned photoresist layer (not shown) to expose conductive layer 132 and a portion of encapsulant 148 outside a footprint of semiconductor die 124. In one embodiment, vias 151 are formed by laser direct ablation (LDA) using laser 153.

In FIG. 4f, an electrically conductive layer or RDL 152 is conformally applied to conductive layer 132 and insulating layer 150, including into vias 151, using a patterning and metal deposition process such as sputtering, electrolytic plating, and electroless plating. Conductive layer 152 can be one or more layers of Al, Cu, Sn, Ni, Au, Ag, or other suitable electrically conductive material. In one embodiment, conductive layer 152 includes a seed layer. Conductive layer 152 follows a contour of insulating layer 150 and conductive layer 132, including into vias 151. One portion of conductive layer 152 is electrically connected to conductive layer 132. Other portions of conductive layer 152 can be electrically common or electrically isolated depending on the design and function of semiconductor die 124.

In FIG. 4g, an insulating or passivation layer 154 is formed over insulating layer 150 and conductive layer 152 using screen printing, spin coating, spray coating, dispensing, or lamination. The insulating layer 154 contains one or more layers of polyimide, epoxy, acrylic or phenolic polymer with or without filler, or other material having similar insulating and structural properties. A plurality of vias 155 is formed through insulating layer 154 using laser drilling or wet/dry etching process through a patterned photoresist layer to expose conductive layer 152. In one embodiment, vias 155 are formed by LDA using laser 157. In particular, vias 155 are aligned with respect to vias 151 over encapsulant 148 outside a footprint of semiconductor die 124. The stacked vias 151 and 155 with vertical alignment provide a design margin for laser removal of the insulating material without penetrating the underlying conductive layer.

Figure 4H:
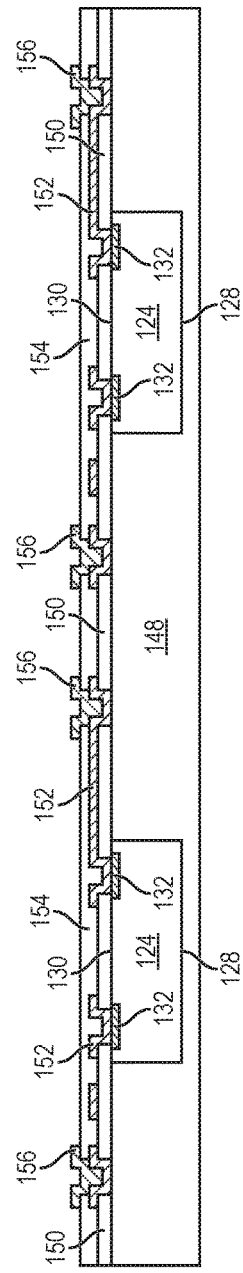

In FIG. 4h, an electrically conductive layer 156 is conformally applied over insulating layer 154 and within vias 155 over the exposed conductive layer 152 using a patterning and metal deposition process such as PVD, CVD, sputtering, electrolytic plating, and electroless plating. Conductive layer 156 can be one or more layers of Al, Cu, Sn, Ni, Au, Ag, or other suitable electrically conductive material. Conductive layer 156 is a multi-metal stacked under bump metallization (UBM) layer with adhesion layer, barrier layer, and seed or wetting layer. The adhesion layer is formed over insulating layer 154 and conductive layer 152 and can be titanium (Ti), titanium nitride (TiN), titanium tungsten (TiW), Al, or chromium (Cr). The barrier layer is formed over the adhesion layer and can be Ni, nickel vanadium (NiV), platinum (Pt), palladium (Pd), TiW, or CrCu. The barrier layer inhibits the diffusion of Cu into the active area of the die. The seed layer is formed over the barrier layer and can be Cu, Ni, NiV, Au, or Al.

Figure 4I:
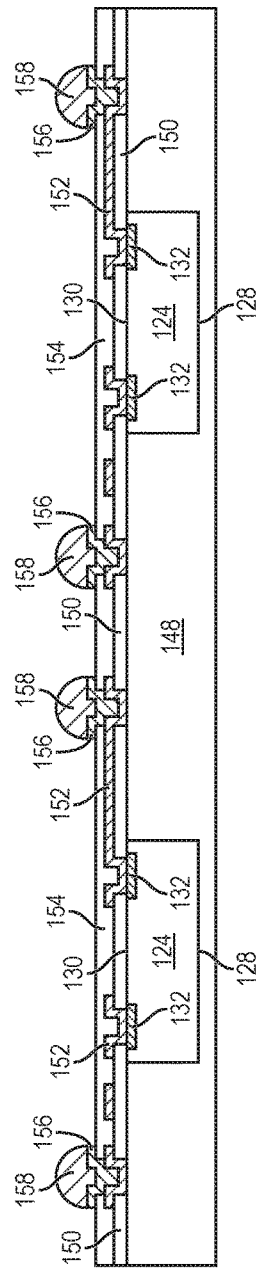

In FIG. 4i, an electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form balls or bumps 158. In some applications, bumps 158 are reflowed a second time to improve electrical contact to conductive layer 156. Bumps 158 can also be compression bonded to conductive layer 156. Bumps 158 represent one type of interconnect structure that can be formed over conductive layer 156. The interconnect structure can also use stud bump, micro bump, or other electrical interconnect.

In FIG. 4j, the reconstituted wafer 146 is singulated through encapsulant 148 and insulating layers 150 and 154 with saw blade or laser cutting tool 160 into individual Fo-WLCSP 162. FIG. 5 shows Fo-WLCSP 162 after singulation. Semiconductor die 124 is electrically connected through conductive layers 132, 152, and 156 to bumps 158. Vias 155 are aligned with respect to vias 151 over encapsulant 148 outside a footprint of semiconductor die 124. Conductive layers 152 and 156 are respectively formed within stacked vias 151 and 155. The stacked vias 151 and 155 with vertical alignment provide a design margin for laser removal of the insulating material without penetrating the underlying conductive layer.

FIG. 6 shows an embodiment of Fo-WLCSP 164 absent conductive layer 156. Bumps 158 are formed directly on conductive layer 152.

Figure 7:
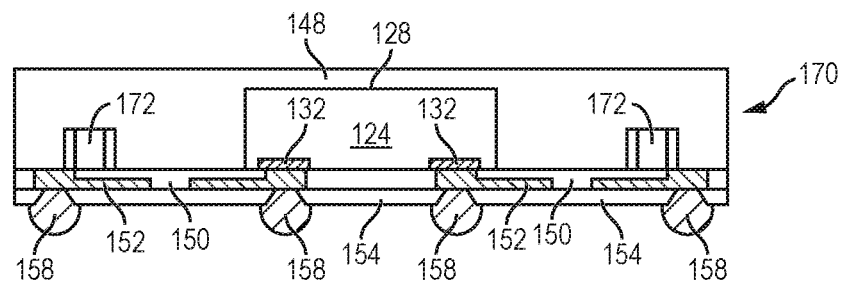
FIG. 7 illustrates the Fo-WLCSP with stacked vias within the interconnect structure and discrete devices.

FIG. 7 shows an embodiment of Fo-WLCSP 170, similar to FIG. 5, with discrete active or passive devices 172 embedded within encapsulant 148. Discrete devices 172 can be resistors, capacitors, inductor, transistors, and diodes. Discrete devices 172 are mounted to interface layer 142 prior to encapsulation, see FIG. 4b. In this embodiment, conductive layer 152 is embedded within insulating layer 150 by forming a trench (in addition to vias 155) in the insulating layer by LDA to contain the conductive layer, similar to FIGS. 15a-15b. Conductive layer 152 is formed in the trenches of insulating layer 150 by semi-additive plating with etch-back or slurry damascene process. Discrete devices 172 are electrically connected to conductive layer 152.

Figure 8A:
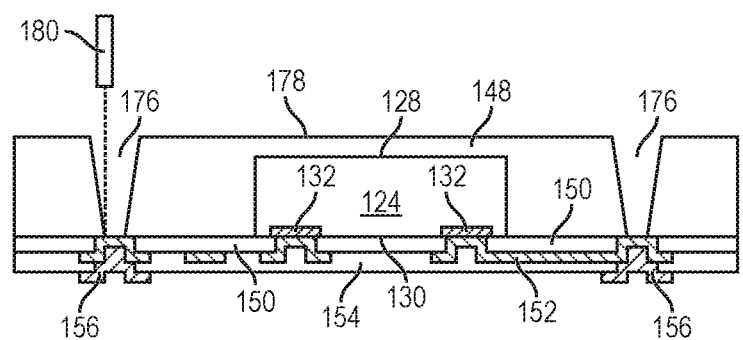
FIGS. 8a-8b illustrate a process of forming conductive TMV within the encapsulant of the Fo-WLCSP.
Figure 8B:
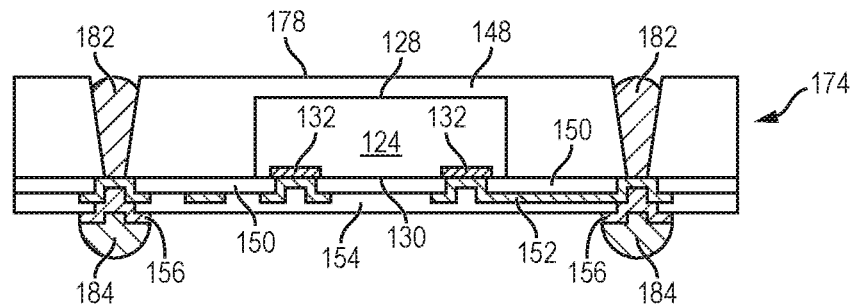

FIGS. 8a-8b show an embodiment of Fo-WLCSP 174, similar to FIG. 5, with conductive vias formed through encapsulant 148. Continuing from FIG. 4i, a plurality of blind vias 176 is formed through encapsulant 148 using mechanical drilling, or laser drilling, as shown in FIG. 8a. Vias 176 extend from surface 178 of encapsulant 148 to conductive layer 152. In one embodiment, vias 176 are formed by LDA using laser 180. The sidewalls of vias 176 can have a tapered, straight, or stepped profile.

In FIG. 8b, vias 176 are filled with Al, Cu, Sn, Ni, Au, Ag, Ti, tungsten (W), poly-silicon, or other suitable electrically conductive material using paste printing with reflow, electrolytic plating, electroless plating process, or other suitable metal deposition process to form z-direction vertical interconnect conductive mold vias (TMV) 182. Conductive TMV 182 are electrically connected to conductive layer 152.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form balls or bumps 184. In some applications, bumps 184 are reflowed a second time to improve electrical contact to conductive layer 156. Bumps 184 can also be compression bonded to conductive layer 156. Bumps 184 represent one type of interconnect structure that can be formed over conductive layer 156. The interconnect structure can also use stud bump, micro bump, or other electrical interconnect.

Figure 9:
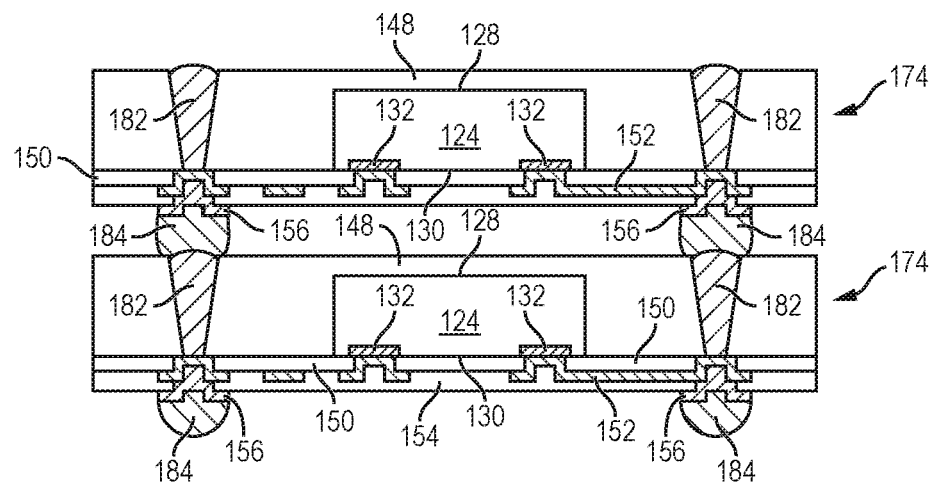
FIG. 9 illustrates two stacked Fo-WLCSP with conductive TMV formed within the encapsulant according to FIGS. 8a-8b.

FIG. 9 shows two stacked Fo-WLCSPs 174 with bumps 184 of the upper Fo-WLCSP 174 electrically connected to conductive TMV 182 of the lower Fo-WLCSP 174. Semiconductor die 124 in the upper Fo-WLCSP 174 is electrically connected through conductive layers 152 and 156 as formed in stacked vias 151 and 155, conductive TMV 182, and bumps 184 to semiconductor die 124 in the lower Fo-WLCSP 174.

Figure 10:
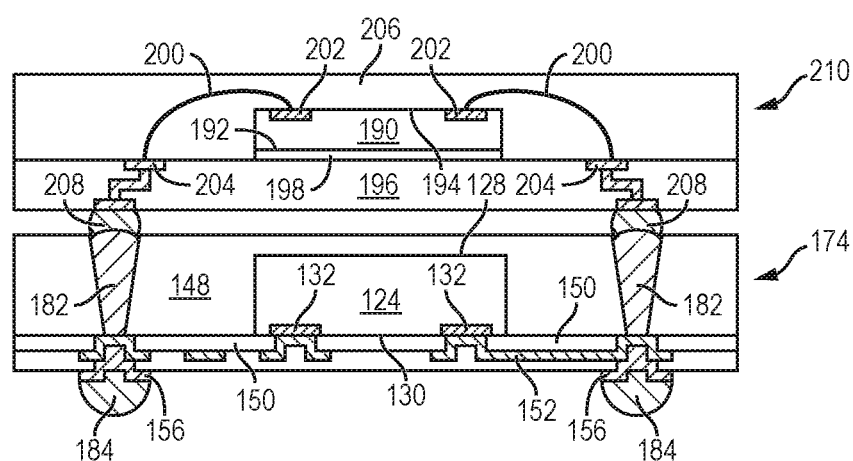
FIG. 10 illustrates a semiconductor package stacked over the Fo-WLCSP with conductive TMV formed within the encapsulant according to FIGS. 8a-8b.

FIG. 10 shows semiconductor die 190 with a back surface 192 and active surface 194 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 194 to implement analog circuits or digital circuits, such as DSP, ASIC, memory, or other signal processing circuit. Semiconductor die 190 may also contain IPDs, such as inductors, capacitors, and resistors, for RF signal processing. In one embodiment, semiconductor die 190 is a wire bond type die.

Semiconductor die 190 is mounted to substrate 196 with adhesive layer 198. Bond wires 200 are formed between contact pads 202 on active surface 194 to conductive traces 204 on substrate 196. An encapsulant or molding compound 206 is deposited over semiconductor die 190, bond wires 200, and substrate 196. A plurality of bumps 208 is formed over conductive traces 204 of substrate 196 opposite semiconductor die 190. Semiconductor package 210 containing semiconductor die 190 and substrate 196 is mounted to Fo-WLCSP 174 in a semiconductor package-on-package (PoP) arrangement. Bumps 208 are reflowed to electrically connect conductive traces 204 to conductive TMV 182.

Semiconductor die 190 in semiconductor package 210 is electrically connected through bond wires 200, conductive traces 204, bumps 208, conductive TMV 182, conductive layers 152 and 156 as formed in stacked vias 151 and 155, to semiconductor die 124 in Fo-WLCSP 174.

Figure 11A:
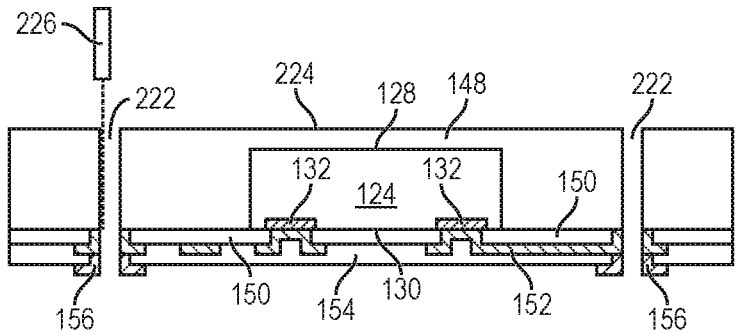
FIGS. 11a-11b illustrate another process of forming conductive TMV within the encapsulant of the Fo-WLCSP.
Figure 11B:
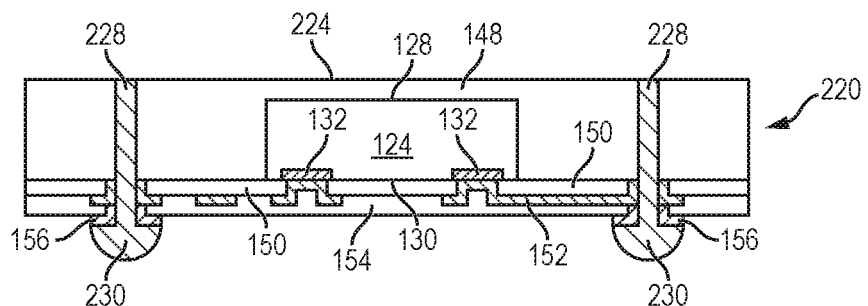

FIGS. 11a-11b show an embodiment of Fo-WLCSP 220, similar to FIG. 5, with conductive vias formed through encapsulant 148. Continuing from FIG. 4i, a plurality of blind vias 222 is formed through encapsulant 148 using mechanical drilling, or laser drilling, as shown in FIG. 11a. Vias 222 extend from surface 224 of encapsulant 148 through conductive layers 152 and 156. In one embodiment, vias 222 are formed by LDA using laser 226. The sidewalls of vias 222 can have a tapered, straight, or stepped profile.

In FIG. 11b, vias 222 are filled with Al, Cu, Sn, Ni, Au, Ag, Ti, W, poly-silicon, or other suitable electrically conductive material using paste printing and reflow, electrolytic plating, electroless plating process, or other suitable metal deposition process to form z-direction vertical interconnect conductive TMV 228. Conductive TMV 228 are electrically connected to conductive layers 152 and 156.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form balls or bumps 230. In some applications, bumps 230 are reflowed a second time to improve electrical contact to conductive layer 156. Bumps 230 can also be compression bonded to conductive layer 156. Bumps 230 represent one type of interconnect structure that can be formed over conductive layer 156. The interconnect structure can also use stud bump, micro bump, or other electrical interconnect.

Figure 12:
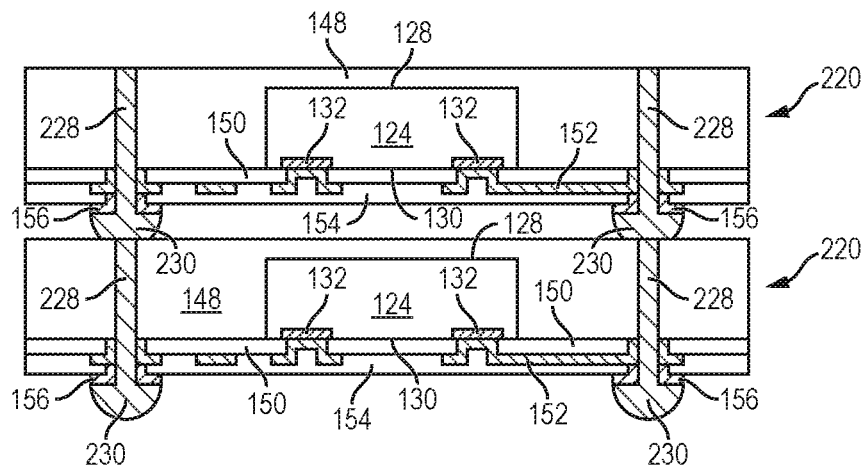
FIG. 12 illustrates two stacked Fo-WLCSP with conductive TMV formed within the encapsulant according to FIGS. 11a-11b.

FIG. 12 shows two stacked Fo-WLCSPs 220 with bumps 230 of the upper Fo-WLCSP 220 electrically connected to conductive TMV 228 of the lower Fo-WLCSP 220. Semiconductor die 124 in the upper Fo-WLCSP 220 is electrically connected through conductive layers 152 and 156 as formed in stacked vias 151 and 155, conductive TMV 228, and bumps 230 to semiconductor die 124 in the lower Fo-WLCSP 220.

Figure 13A:
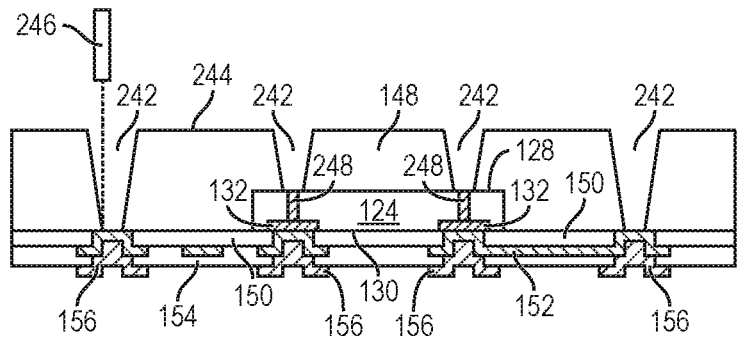
FIGS. 13a-13b illustrate another process of forming conductive TMV within the encapsulant of the Fo-WLCSP.
Figure 13B:
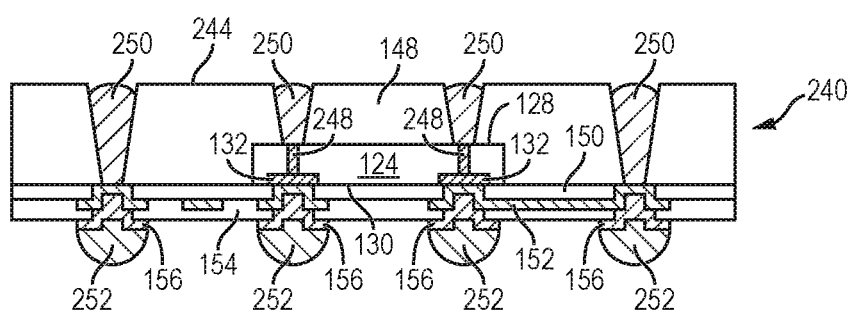

FIGS. 13a-13b show an embodiment of Fo-WLCSP 240, similar to FIG. 5, with conductive vias formed through encapsulant 148. Continuing from FIG. 4i, a plurality of blind vias 242 is formed through encapsulant 148 using mechanical drilling, laser drilling, or deep reactive ion etching (DRIE), as shown in FIG. 13a. Vias 242 extend from surface 244 of encapsulant 148 to conductive layer 152 and back surface 128 of semiconductor die 124. In one embodiment, vias 242 are formed by LDA with tapered, straight, or stepped sidewalls using laser 246.

In this embodiment, a plurality of vias is formed through semiconductor die 124 using mechanical drilling, laser drilling, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive through silicon vias (TSV) 248. Conductive TSV 248 are electrically connected to conductive layer 132.

In FIG. 13b, vias 242 are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive TMV 250. Conductive TMV 250 are electrically connected to conductive layers 152 and 156 and conductive TSV 248.

An electrically conductive bump material is deposited over conductive layer 156 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 156 using a suitable attachment or bonding process. In one embodiment, the bump material is reflowed by heating the material above its melting point to form balls or bumps 252. In some applications, bumps 252 are reflowed a second time to improve electrical contact to conductive layer 156. Bumps 252 can also be compression bonded to conductive layer 156. Bumps 252 represent one type of interconnect structure that can be formed over conductive layer 156. The interconnect structure can also use stud bump, micro bump, or other electrical interconnect.

Figure 14:
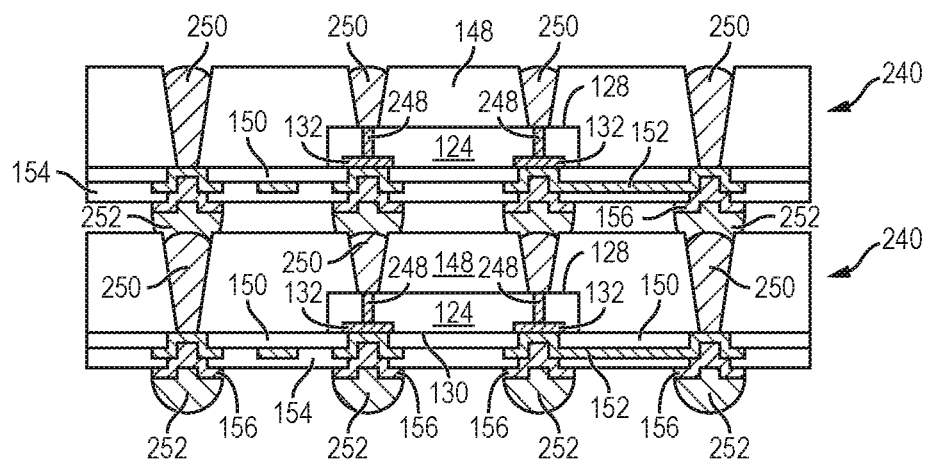
FIG. 14 illustrates two stacked Fo-WLCSP with conductive TMV formed within the encapsulant according to FIGS. 13a-13b.

FIG. 14 shows two stacked Fo-WLCSPs 240 with bumps 252 of the upper Fo-WLCSP 240 electrically connected to conductive TMV 250 of the lower Fo-WLCSP 240. Semiconductor die 124 in the upper Fo-WLCSP 240 is electrically connected through conductive layers 152 and 156 as formed in stacked vias 151 and 155, conductive TMV 250, conductive TSV 248, and bumps 252 to semiconductor die 124 in the lower Fo-WLCSP 240.

Figure 15A:
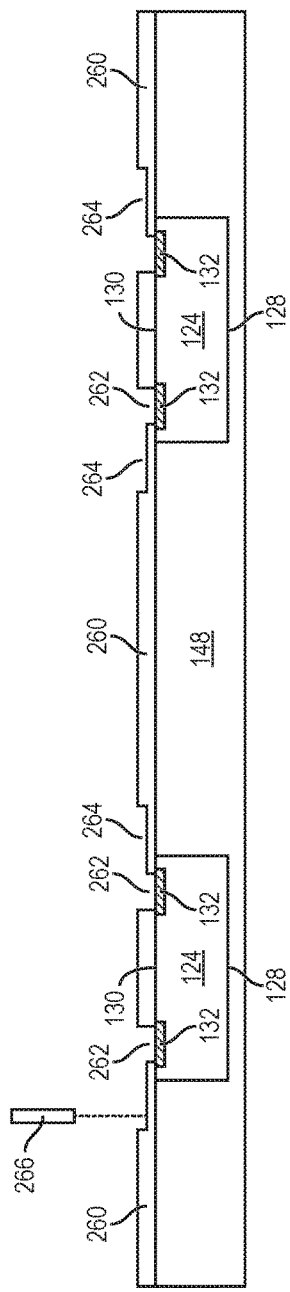
FIGS. 15a-15f illustrate a process of forming RDL embedded within an insulating layer of the Fo-WLCSP.

FIGS. 15a-15f illustrate, in relation to FIGS. 1 and 2a-2c, a process of forming an RDL embedded within an insulating layer of the Fo-WLCSP. Continuing from FIG. 4d, an insulating or passivation layer 260 is formed over active surface 130, conductive layer 132, and encapsulant 148 using screen printing, spin coating, spray coating, dispensing, or lamination, as shown in FIG. 15a. The insulating layer 260 contains polyimide, epoxy, acrylic or phenolic polymer with or without filler, or other suitable material having similar insulating and structural properties. A plurality of vias 262 and channels 264 is formed in insulating layer 260 using laser drilling or wet/dry etching process through a patterned photoresist layer to expose conductive layer 132. In one embodiment, vias 262 and channels 264 are formed by LDA using laser 266.

Figure 15B:
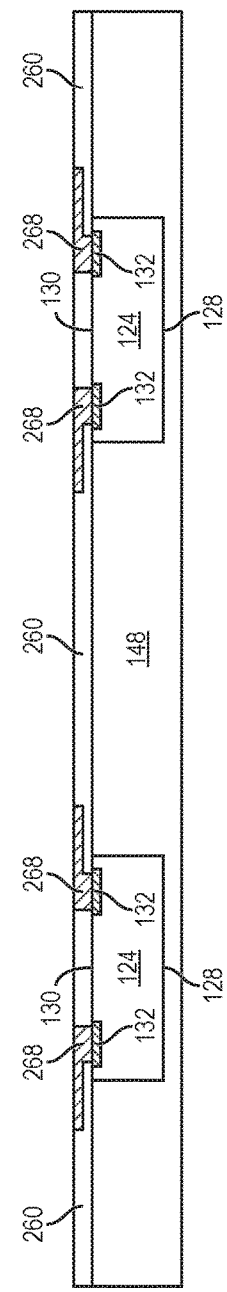

In FIG. 15b, an electrically conductive layer or RDL 268 is formed over conductive layer 132 and insulating layer 260, including into vias 262 and channels 264, using a patterning and metal deposition process such as sputtering, electrolytic plating, and electroless plating. Conductive layer 268 can be one or more layers of Al, Cu, Sn, Ni, Au, Ag, or other suitable electrically conductive material. In one embodiment, conductive layer 268 includes a seed layer. Conductive layer 268 is embedded within insulating layer 260. One portion of conductive layer 268 is electrically connected to conductive layer 132. Other portions of conductive layer 268 can be electrically common or electrically isolated depending on the design and function of semiconductor die 124.

Figure 15C:
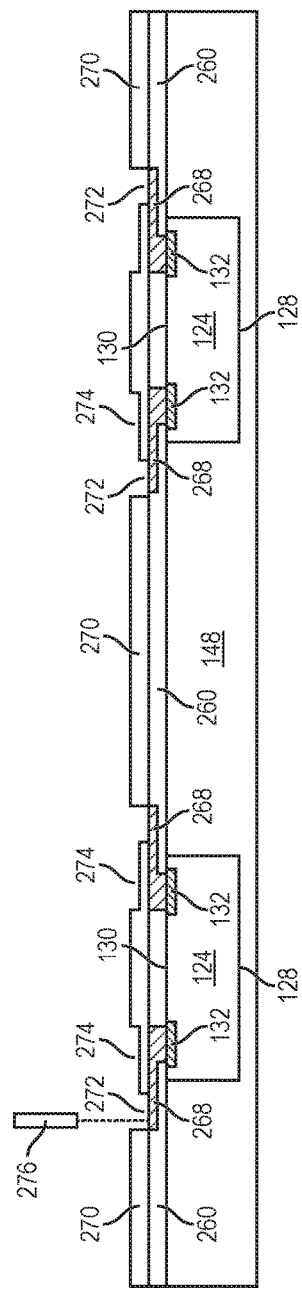

In FIG. 15c, an insulating or passivation layer 270 is formed over insulating layer 260 and conductive layer 268 using screen printing, spin coating, spray coating, dispensing, or lamination, as shown in FIG. 15c. The insulating layer 270 contains polyimide, epoxy, acrylic or phenolic polymer with or without filler, or other suitable material having similar insulating and structural properties. A plurality of vias 272 and channels 274 is formed in insulating layer 270 using laser drilling, mechanical drilling, or wet/dry etching process through a patterned photoresist layer to expose conductive layer 268. In one embodiment, vias 272 and channels 274 are formed by LDA using laser 276. In particular, vias 272 are offset with respect to vias 262. The stacked vias 262 and 272 with lateral offset provides a design margin for laser removal of the insulating material without penetrating the underlying conductive layer.

Figure 15D:
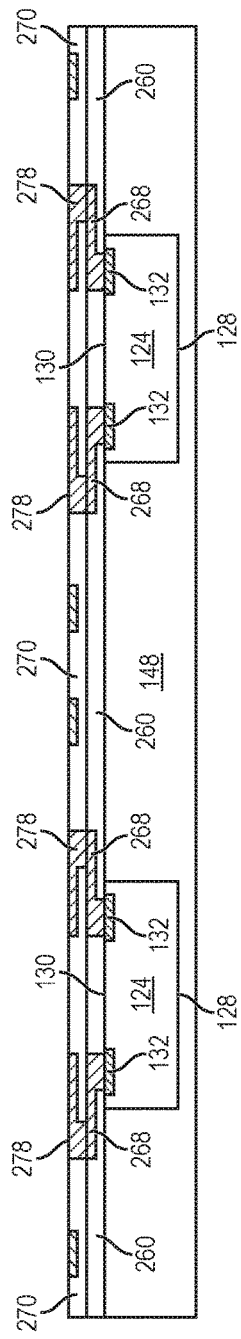

In FIG. 15d, an electrically conductive layer or RDL 278 is formed over conductive layer 268 and insulating layer 270, including into vias 272 and channels 274, using a patterning and metal deposition process such as sputtering, electrolytic plating, and electroless plating. Conductive layer 278 can be one or more layers of Al, Cu, Sn, Ni, Au, Ag, or other suitable electrically conductive material. In one embodiment, conductive layer 278 includes a seed layer. Conductive layer 278 is embedded within insulating layer 270. One portion of conductive layer 278 is electrically connected to conductive layer 268. Other portions of conductive layer 278 can be electrically common or electrically isolated depending on the design and function of semiconductor die 124.

Figure 15E:
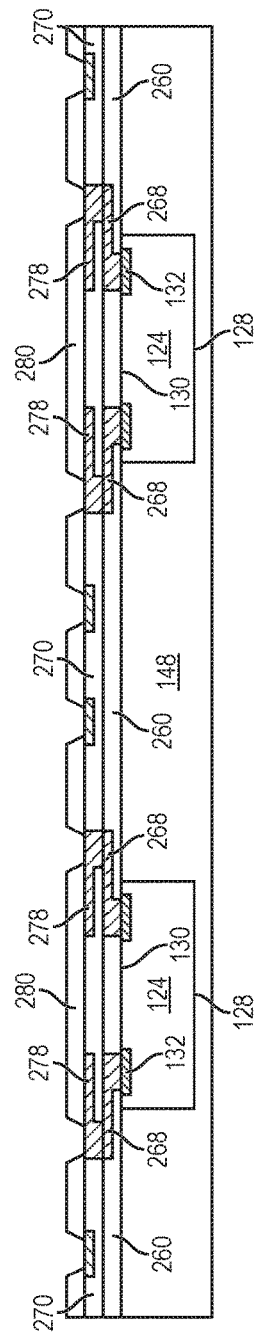

In FIG. 15e, an insulating or passivation layer 280 is formed over insulating layer 270 and conductive layer 278 using PVD, CVD, screen printing, spin coating, spray coating, dispensing, lamination, sintering or thermal oxidation. The insulating layer 280 contains one or more layers of SiO2, Si3N4, SiON, Ta2O5, Al2O3, or other material having similar insulating and structural properties. A portion of insulating layer 280 is removed by laser drilling, mechanical drilling, or wet/dry etching process through a patterned photoresist layer to expose conductive layer 278.

Figure 15F:
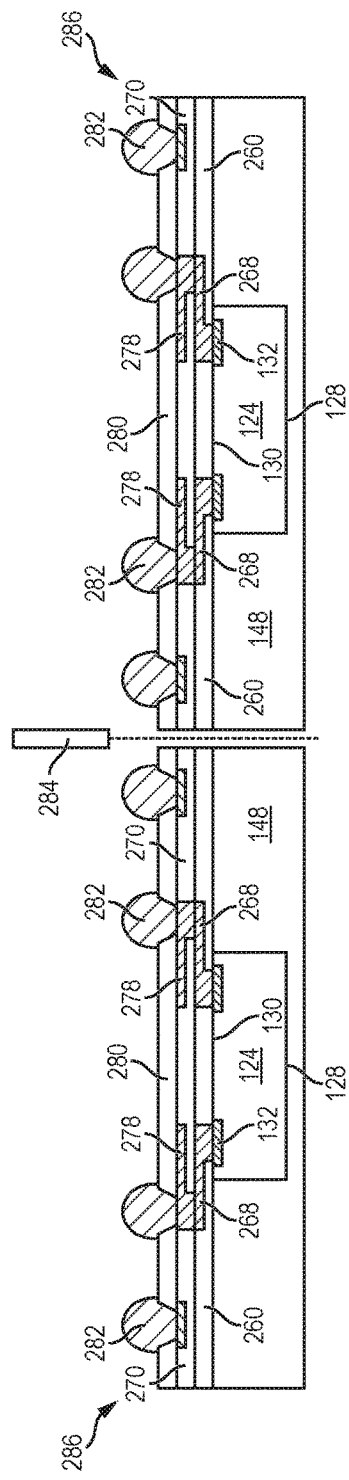

In FIG. 15f, an electrically conductive bump material is deposited over conductive layer 278 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 278 using a suitable attachment or bonding process. In one embodiment, the bump material is reflowed by heating the material above its melting point to form balls or bumps 282. In some applications, bumps 282 are reflowed a second time to improve electrical contact to conductive layer 278. Bumps 282 can also be compression bonded to conductive layer 278. Bumps 282 represent one type of interconnect structure that can be formed over conductive layer 278. The interconnect structure can also use stud bump, micro bump, or other electrical interconnect.

Figure 16:
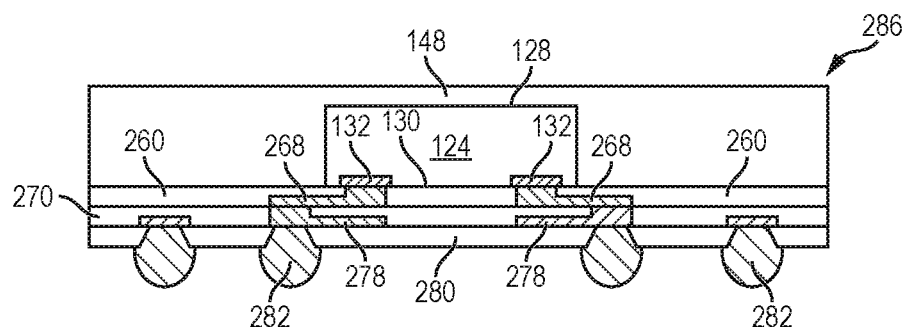
FIG. 16 illustrates the Fo-WLCSP with the RDL embedded within the insulating layer.

Semiconductor die 124 are singulated through encapsulant 148 and insulating layers 260, 270, and 280 with saw blade or laser cutting tool 284 into individual Fo-WLCSP 286. FIG. 16 shows Fo-WLCSP 286 after singulation. Semiconductor die 124 is electrically connected through conductive layers 132, 268, and 278 to bumps 282. Vias 272 are laterally offset with respect to vias 262. Conductive layers 268 and 278 are respectively formed within the laterally offset stacked vias 262 and 272. The stacked vias 262 and 272 with lateral offset provide a design margin for laser removal of the insulating material without penetrating the underlying conductive layer.

Figure 17:
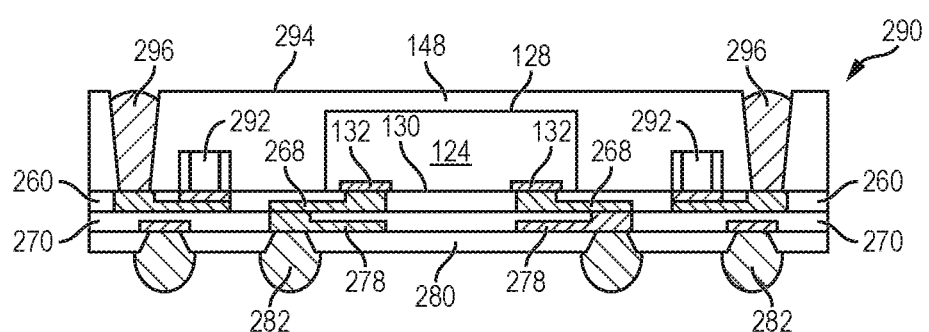
FIG. 17 illustrates the Fo-WLCSP with embedded RDL, discrete semiconductor devices, and conductive TMV formed within the encapsulant.

FIG. 17 shows an embodiment of Fo-WLCSP 290, similar to FIG. 16, with discrete active or passive devices 292 embedded within encapsulant 148. Discrete devices 292 can be resistors, capacitors, inductor, transistors, and diodes. Discrete devices 292 are mounted to interface layer 142 prior to encapsulation, see FIG. 4b. Discrete devices 292 are electrically connected to conductive layer 268.

A plurality of blind vias is formed through encapsulant 148 using mechanical drilling, laser drilling, or DRIE. The blind vias extend from surface 294 of encapsulant 148 to conductive layer 268. In one embodiment, the blind vias are formed by LDA using a laser. The via sidewalls can have a tapered, straight, or stepped profile. The blind vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive TMV 296. Conductive TMV 296 are electrically connected to conductive layers 268 and 278.

Semiconductor die 124 is electrically connected through conductive layers 132, 268, and 278 to bumps 282. Semiconductor die 124 is also electrically connected through conductive layer 268 to conductive TMV 296 for vertical electrical interconnect. Additional semiconductor die or packages can be mounted to Fo-WLCSP 290 and electrically connected to conductive TMV 296, similar to FIGS. 9, 10, 12, and 14. Vias 272 are laterally offset with respect to vias 262. Conductive layers 268 and 278 are respectively formed within the laterally offset stacked vias 262 and 272. The stacked vias 262 and 272 with lateral offset provide a design margin for laser removal of the insulating material without penetrating the underlying conductive layer.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die;
   an encapsulant deposited over and around the semiconductor die;
   a first insulating layer formed over the semiconductor die and encapsulant including a first opening formed through the first insulating layer;
   a first conductive layer formed over a top surface of the first insulating layer and extending through the first opening to the encapsulant;
   a second insulating layer formed over the semiconductor die and encapsulant including a second opening formed through the second insulating layer, wherein a size of the second opening at the first conductive layer is approximately equal to a size of the first opening, and the second opening is aligned with the first opening;
   a second conductive layer formed over a top surface of the second insulating layer and extending through the second opening to the first conductive layer;
   a third opening formed through the encapsulant, first conductive layer, and second conductive layer, wherein a size of the third opening at the first conductive layer is smaller than the size of the first opening and the size of the second opening; and
   a solder material deposited in the third opening to form a conductive via, wherein the solder material in the third opening is exposed from a top surface of the encapsulant opposite the first conductive layer.

2. The semiconductor device of claim 1, further including:
   a second conductive via formed through the semiconductor die; and a third conductive via formed through the encapsulant and electrically connected to the second conductive via.

3. The semiconductor device of claim 1, further including a semiconductor package disposed over the semiconductor die and encapsulant, wherein the semiconductor package includes a solder bump aligned with the opening and electrically connected to the solder material.

4. The semiconductor device of claim 1, further including a plurality of stacked semiconductor devices electrically connected through the first conductive via of each of the stacked semiconductor devices.

5. The semiconductor device of claim 1, wherein the first opening includes a substantially uniform cross-section for an entire height of the first insulating layer, and the second opening includes a substantially uniform cross-section for an entire height of the second insulating layer.

6. A semiconductor device, comprising:
a semiconductor die;
an encapsulant deposited over the semiconductor die;
a first insulating layer formed over the semiconductor die and encapsulant including a first opening formed through the first insulating layer;
a first conductive layer formed over the first insulating layer with a portion of the first conductive layer extending through the first opening of the first insulating layer to the encapsulant;
a second insulating layer formed over the first insulating layer including a second opening formed through the second insulating layer and aligned with the first opening, wherein a size of the second opening is approximately equal to a size of the first opening;
a second conductive layer formed over the second insulating layer with a portion of the second conductive layer extending through the second opening of the second insulating layer to the first conductive layer; and
a first conductive via formed through the encapsulant and extending through the first conductive layer.

7. The semiconductor device of claim 6, further including an interconnect structure formed over the second conductive layer and the portion of the first conductive layer extending through the first insulating layer to the encapsulant.

8. The semiconductor device of claim 6, further including a second conductive via formed through the semiconductor die and electrically connected to the first conductive via.

9. The semiconductor device of claim 6, further including a discrete device embedded in the encapsulant around the semiconductor die.

10. The semiconductor device of claim 6, wherein the first conductive layer extends to the semiconductor die.

11. A semiconductor device, comprising:
a semiconductor die;
an encapsulant deposited over the semiconductor die;
a first insulating layer formed over the semiconductor die and encapsulant including a first opening in the first insulating layer over the encapsulant;
a first conductive layer formed over a top surface of the first insulating layer and extending into the first opening, wherein a top surface of the first conductive layer includes a recess;
a second insulating layer formed over the first insulating layer and first conductive layer including a second opening in the second insulating layer aligned with the first opening in the first insulating layer; and
a second conductive layer formed over a top surface of the second insulating layer and extending into the second opening and the recess of the first conductive layer.

12. The semiconductor device of claim 11, further including a discrete device embedded in the encapsulant around the semiconductor die.

13. The semiconductor device of claim 11, further including a semiconductor package disposed over the semiconductor die and encapsulant.

14. The semiconductor device of claim 11, wherein the second conductive layer in the second opening contacts the first conductive layer in the first opening.

15. The semiconductor device of claim 11, wherein the second conductive layer is conformally applied over the second insulating layer.

16. The semiconductor device of claim 11, wherein a size of the second opening at the first conductive layer is approximately equal to a size of the first opening.

17. The semiconductor device of claim 16, further including a conductive via formed through the encapsulant and extending to the first conductive layer, wherein a size of the conductive via at the first conductive layer is less than the size of the first opening and the size of the second opening.

18. A semiconductor device, comprising:
a semiconductor die;
an encapsulant deposited over the semiconductor die;
a first insulating layer formed over the semiconductor die and encapsulant;
a first conductive layer formed over the first insulating layer and extending through the first insulating layer to the encapsulant;
an opening formed through the encapsulant and first conductive layer; and
a conductive material deposited in the opening, wherein the conductive material substantially fills the opening with a surface of the conductive material in the opening remaining exposed from a surface of the encapsulant opposite the first conductive layer.

19. The semiconductor device of claim 18, further including:
a first conductive via formed through the semiconductor die; and
a second conductive via formed through the encapsulant and electrically connected to the first conductive via.

20. The semiconductor device of claim 18, further including a discrete device embedded in the encapsulant around the semiconductor die.

21. The semiconductor device of claim 18, further including a semiconductor package disposed over the semiconductor die and encapsulant, wherein the semiconductor package includes a solder bump aligned with the opening.

* * * * *